United States Patent [19]
Dormans et al.

[11] Patent Number: 5,879,990
[45] Date of Patent: Mar. 9, 1999

[54] SEMICONDUCTOR DEVICE HAVING AN EMBEDDED NON-VOLATILE MEMORY AND METHOD OF MANUFACTURING SUCH A SEMICONDUTOR DEVICE

[75] Inventors: Guido J. M. Dormans; Robertus D. J. Verhaar; Roger Cuppens, all of Eindhoven, Netherlands

[73] Assignee: U.S. Philips Corporation, New York, N.Y.

[21] Appl. No.: 814,868

[22] Filed: Mar. 11, 1997

[30] Foreign Application Priority Data

Mar. 22, 1996 [EP] European Pat. Off. ........... 96200791.0

[51] Int. Cl.[6] .................................................. H01L 29/788
[52] U.S. Cl. ........................... 438/257; 438/258; 257/316
[58] Field of Search ..................... 257/316–322; 438/257, 258

[56] References Cited

U.S. PATENT DOCUMENTS

| | | |
|---|---|---|
| 4,635,347 | 1/1987 | Lien et al. . |
| 4,646,425 | 3/1987 | Owens et al. . |
| 4,775,642 | 10/1988 | Chang et al. . |
| 4,780,431 | 10/1988 | Maggioni et al. . |
| 5,188,976 | 2/1993 | Kume et al. . |
| 5,395,778 | 3/1995 | Walker ...................................... 437/12 |
| 5,449,629 | 9/1995 | Kajita . |

*Primary Examiner*—David B. Hardy
*Attorney, Agent, or Firm*—Steven R. Biren

[57] ABSTRACT

The invention relates in particular, though not exclusively, to an integrated circuit with an embedded non-volatile memory with floating gate (10). According to the invention, at least two poly layers of equal or at least substantially equal thickness are used for this device. The first poly layer, poly A, is for the floating gate (10) and for the gates (22) of NMOS and PMOS in the logic portion of the circuit. The second poly layer, poly B, serves exclusively for the control electrode (21) above the floating gate. If so desired, a third poly layer may be deposited for both the control electrode and the logic gates, so that the thicknesses of these electrodes, and thus their resistances, are given desired values. Problems like overetching and bridging during saliciding are prevented in that the control electrode and the logic gates have the same thickness.

4 Claims, 3 Drawing Sheets

SEMICONDUCTOR DEVICE HAVING AN EMBEDDED NON-VOLATILE MEMORY AND METHOD OF MANUFACTURING SUCH A SEMICONDUTOR DEVICE

BACKGROUND OF THE INVENTION

The invention relates to a semiconductor device with a semiconductor body made of silicon which is provided at a surface with a first MOS transistor with an insulated gate of polycrystalline or amorphous silicon and with a non-volatile programmable memory element in the form of a second MOS transistor with an electrically floating gate of polycrystalline or amorphous silicon and with a control electrode of polycrystalline or amorphous silicon situated above the floating gate and electrically insulated therefrom. The invention also relates to a method of manufacturing a semiconductor device with a semiconductor body made of silicon which is provided at a surface with a first MOS transistor with an insulated gate of polycrystalline or amorphous silicon and with a non-volatile programmable memory element in the form of a second MOS transistor with an electrically floating gate of polycrystalline or amorphous silicon and with a control electrode of polycrystalline or amorphous silicon situated above the floating gate and electrically insulated therefrom.

The term "poly" will be used hereinafter for short; It should be borne in mind that this term covers not only polycrystalline silicon but also amorphous silicon.

Such a semiconductor device and a method of manufacturing this semiconductor device are known inter alia from Applicant's U.S. Pat. No. 5,395,778.

The memory element together with a large number of similar elements will usually form part of a non-volatile memory which is familiar under the designations EEPROM or (flash) EPROM. This memory may be of a stand-alone type, in which case the semiconductor device mainly comprises the memory and the peripheral electronics necessary for it. Said first MOS transistor may then be formed by a transistor from the periphery, but also by a selection transistor which forms a memory cell together with a memory transistor. In alternative embodiments for which the invention is of particular, though not exclusive importance, the memory may be embedded, the semiconductor device being an integrated signal processing circuit with a built-in non-volatile memory. A standard CMOS process is mostly used for the manufacture of such a circuit, supplemented with a few additional process steps for the memory in the signal processing portion (called logic hereinafter). As is generally known, information is written in the form of electric charge which is stored on the floating gate and which defines the threshold voltage of the transistor. The information may be read in that it is ascertained whether the transistor is conducting or not, given a suitable voltage at the control electrode.

The cited patent U.S. Pat. No. 5,395,778 describes a process in which the floating gate and the control electrode are provided in a split-poly process where the poly deposition necessary for forming the logic gates is carried out in two steps. In the first step, a first partial layer for the logic is formed as well as the poly layer of the floating gate, which is subsequently covered with an interpoly dielectric. In the second step, the remainder of the poly layer is provided for the logic gates while at the same time a poly layer for the control electrode is formed above the poly, layer of the floating gate, electrically insulated therefrom by the interpoly dielectric.

The poly layer in the logic has a greater thickness than the poly layer of the control electrode in the memory in this process, which leads to drawbacks under some circumstances. Thus it may be necessary to carry out an overetching in the memory portion if the control electrode and the insulated gates of the logic are simultaneously defined and etched. Another drawback may arise when the sides of the control electrodes and of the insulated gates are both provided with spacers through deposition and etching-back of an oxide layer. It is possible in this case that the oxide layer in the memory portion is etched back too far relatively as a result of the thickness difference between the poly layers. This in its turn may lead to short-circuits (bridging) when subsequently the source and drain zones and the gates are provided with silicide contacts in a salicide process known per se.

SUMMARY OF THE INVENTION

The invention has for its object inter alia to counteract these drawbacks at least substantially. According to the invention, a semiconductor device of the kind described in the opening paragraph is for this purpose characterized in that the thickness of the insulated gate is greater than or equal to the thickness of the floating gate and equal to or at least substantially equal to the thickness of the control electrode. Giving the control electrode of the memory transistor the same thickness as the insulated gate of the MOS logic transistor renders it possible to avoid problems described above. A first embodiment which has the advantage inter alia that the insulated gate is formed by a single poly layer is characterized in that the floating gate and the insulated gate are of equal thickness and are manufactured from a common first deposited silicon layer, and in that the control electrode is manufactured from a second deposited silicon layer. A second embodiment which has the advantage inter alia that the thickness of the floating gate can be chosen independently of the thickness of the logic gates is characterized in that the insulated gate and the control electrode have a greater thickness than the floating gate. The thickness of the first poly layer in this embodiment may be small, so that the structure obtained is comparatively plane, which is favorable for subsequent process steps.

A further embodiment of a semiconductor device according to the invention in which the advantage of low series resistances is obtained is characterized in that the control electrode, the insulated gate, and the source and drain zones of the MOS transistors are provided with a comparatively low-ohmic silicide top layer comprising an alloy of silicon and a metal. The silicide is preferably provided in a self-aligned manner (salicide), for example by means of a Ti layer which forms a silicide in contact with silicon, remains unchanged in contact with oxide, and can be removed selectively at the area of the oxide.

According to the invention, a method of the kind described in the opening paragraph is characterized by the following steps definition of a first active region for the first MOS transistor and of a second active region for the second MOS transistor, both at the surface of the semiconductor body;

provision of an electrically insulating layer on the first and second active regions so as to form the gate dielectrics of the first and second MOS transistors, respectively;

deposition of a first polycrystalline or amorphous silicon layer above the first and second active regions, separated therefrom by the insulating layer;

provision of a dielectric layer on the first silicon layer;

provision of a second polycrystalline or amorphous silicon layer above the first silicon layer and separated therefrom by the dielectric layer, the thickness of the second silicon layer being equal or at least substantially equal to the thickness of the first silicon layer;

removal of the second silicon layer at the area of the first active region;

definition of the floating gate, the control electrode, and the insulated gate from the deposited silicon layers.

The problems mentioned above can be avoided in a simple manner by this method. The process can furthermore be carried out such that first the floating gate and then the source and drain zones of the memory transistors are provided after the deposition of the first poly layer, while in the logic region the surface is masked by the first poly layer, whereupon in a second series of process steps the logic portion is manufactured. This renders it possible also to obtain the advantages of the process described in U.S. Pat. No. 5,395,778, the contents of which are to be regarded as included in the present Application by reference.

An important further embodiment of a method according to the invention whereby low series resistances can be obtained in a simple manner is characterized in that the source and drain zones of the MOS transistors, the control electrode, and the insulated gate are provided with a silicide top layer comprising an alloy of silicon and a metal by means of a salicide process.

BRIEF DESCRIPTION OF THE DRAWINGS

These and other aspects of the invention will be explained in more detail with reference to several embodiments and the accompanying diagrammatic drawing, in which.

DESCRIPTION OF THE PREFERRED EMBODIMENTS

Figure 1:
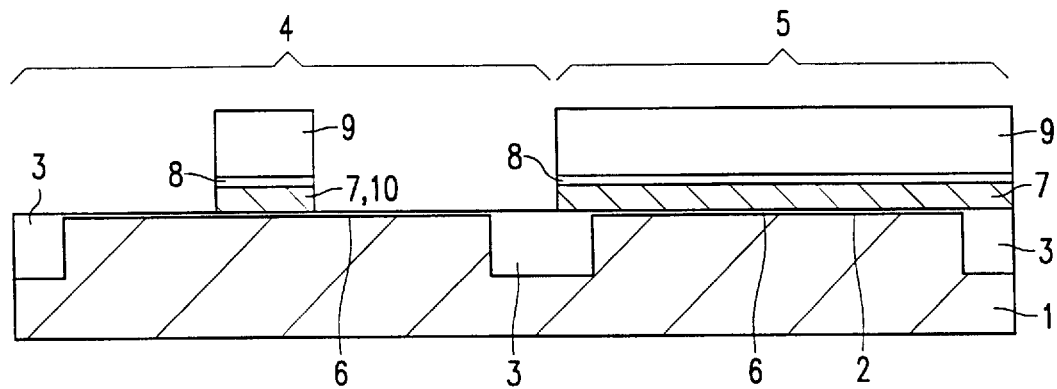
FIGS. 1 to 8 show a semiconductor device according to the invention in cross-section in a few stages of its manufacture.

A first embodiment of an integrated circuit with three layers of polycrystalline silicon, referred to as poly A, B, and C hereinafter, will now be described with reference to FIGS. 1 to 7. The process starts with a silicon body with a surface region 1 of a first conductivity type, in this example the p-type, adjoining a surface 2. Active regions are defined in the surface region 1 by means of a pattern of field oxide 3, two such regions being shown, i.e. regions 4 and 5. The active region 4 is for the memory cell, the region 5 for the MOS transistor of the logic, referred to as MOST for short hereinafter. The field oxide may be provided in a usual manner, for example through local oxidation of the silicon body, and has a thickness of, for example, approximately 550 nm. The oxidation mask may be removed after the oxidation step, whereupon various implantations may be carried out if so desired, for example, an n-well implantation for the p-channel transistors to be formed. In a next step the gate dielectric 6 is then provided on the surface in the form of a silicon oxide layer of, for example, 12 nm thickness. It is noted that the gate dielectrics in the present example have the same thicknesses in the active regions, but this is not necessarily the case. The thickness of the gate oxide of the MOST may accordingly differ from that of the memory transistor. Now the first polycrystalline or amorphous silicon layer 7, poly A, is deposited to a thickness of, for example, 150 nm. The poly layer is n-type doped during or after the deposition, for example with phosphorus in a concentration of approximately $1.3*10^{19}$ atoms per $cm^3$. The poly layer 7 in this example is covered with a layer 8 which masks the poly against oxidation and which comprises an oxynitride layer or a composite layer of silicon oxide and nitride. Then a photoresist mask 9 is provided, covering the active region 5 of the logic MOST and defining the floating gate in the active region 4 of the memory cell. The layer 8 and the poly layer 7 are subsequently etched into a pattern, whereby the floating gate 10 is formed in the active region 4. The active region 5 remains covered by poly A over its entire surface. This stage is shown in FIG. 1.

Figure 2:
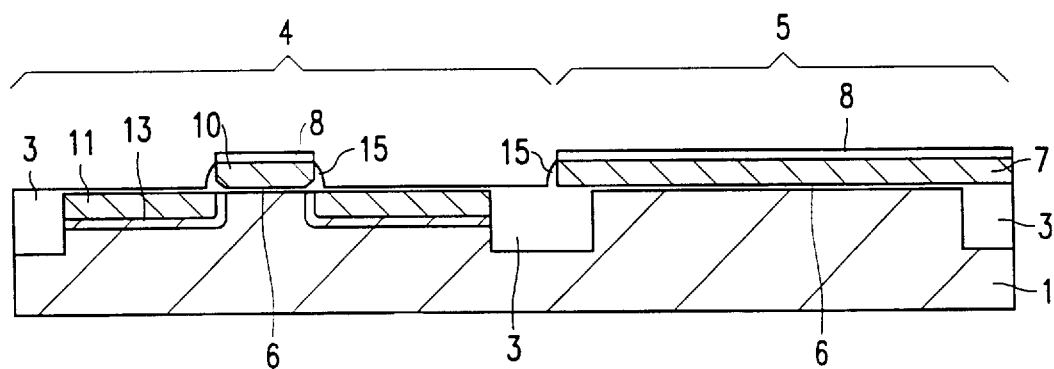

The mask 9 may be removed in this stage, whereupon the n-type source and drain zones 11, 12 of the memory transistor are provided through implantation of, for example, As with a doping concentration of $3*10^{15}$ per $cm^2$ and an energy of approximately 60 keV. If so desired, for example in the case of an OTP (One Time Programmable) memory, the background concentration of boron around the zones 11 and 12 may also be enhanced through implantation of boron ions with a concentration of $10^{14}$ ions per $cm^2$ and an energy of 20 keV, diagrammatically depicted in FIG. 2 as zones 13 and 14. These p-type zones will no longer be indicated in the subsequent stages shown in the drawing. In the case of a Flash memory, a comparatively weakly doped n-type zone may be provided around the source zone 11 instead of the p-type zone 13 in this stage. Then oxide 15 is grown on the flanks of the poly through thermal oxidation, during which the upper side of the poly is masked by the layer 8. FIG. 2 shows the device in this stage of the production process.

Figure 3:
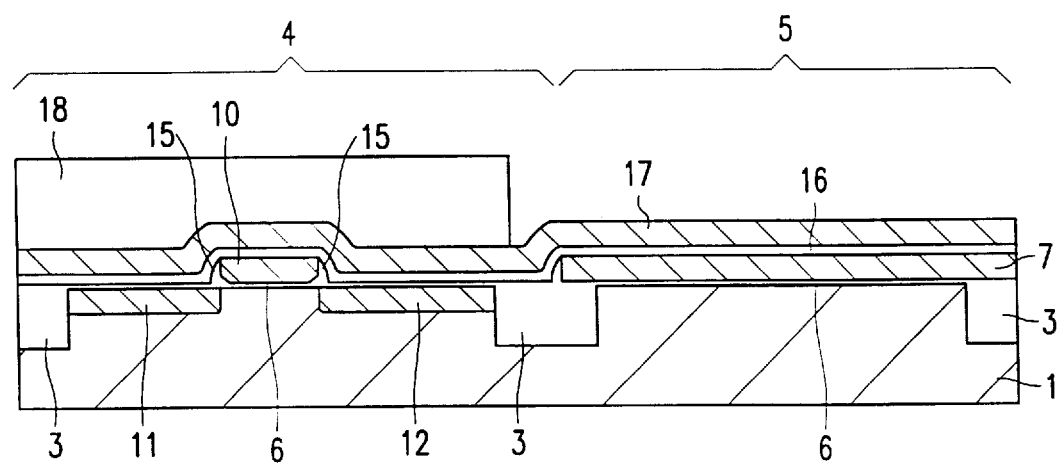

In a next step, the layer 8 is removed and an approximately 35 nm thick layer 16 is formed which constitutes an interpoly dielectric (IPD) between the floating gate and the control electrode in the memory cell. This layer in the present embodiment is a silicon oxynitride layer, but it may alternatively be formed by a composite oxide-nitride-oxide layer (ONO) with a thickness of approximately 35 nm, but it may obviously alternatively also comprise, for example, oxide only. A second poly (or amorphous) layer 17, poly B, is deposited on the layer 16. The layer 17 has a thickness which is equal or at least substantially equal to the thickness of the first poly layer, i.e. approximately 150 nm. The layer 17 is n-type doped through implantation of P ions with a concentration equal or substantially equal to the concentration in poly A. Then the memory region 4 is masked by means of a photomask 18. This stage is depicted in FIG. 3.

The poly layer 17 and the layer 16 are now removed in those locations which are not masked by the mask 18, i.e. in the active region 5, so that only the poly layer 7, whose thickness is equal to that of the poly layer 17, remains in the active region 5. The photomask 18 is subsequently removed again. The device is now in the stage shown in FIG. 4.

In a next stage, a third poly layer 19, poly C, is deposited and n-type doped with a concentration equal or substantially equal to the concentration of the preceding poly layers. The thickness of the poly layer 19 in the present example is 150 nm again, so equal to the thicknesses of the poly layers 7 and 17. Alternatively, however, the thickness of the poly layer 19 may have a different value and may be chosen such, for example, that the gates to be formed have a suitable resistance value. Subsequently, see FIG. 5, a new photomask 20 is provided defining the control electrode of the memory transistor in the active region 4 and defining the gate of the MOS transistor of the logic in the active region 5. The non-masked poly is subsequently etched away, so that (FIG. 6) the control electrode 21 of the memory transistor and the insulated gate 22 of the logic MOST are obtained. Since the gates 21 and 22 are of equal or at least substantially equal thickness, overetching which is often necessary for etching layers of different thicknesses is unnecessary now. The mask 20 is removed again after this.

Figure 7:
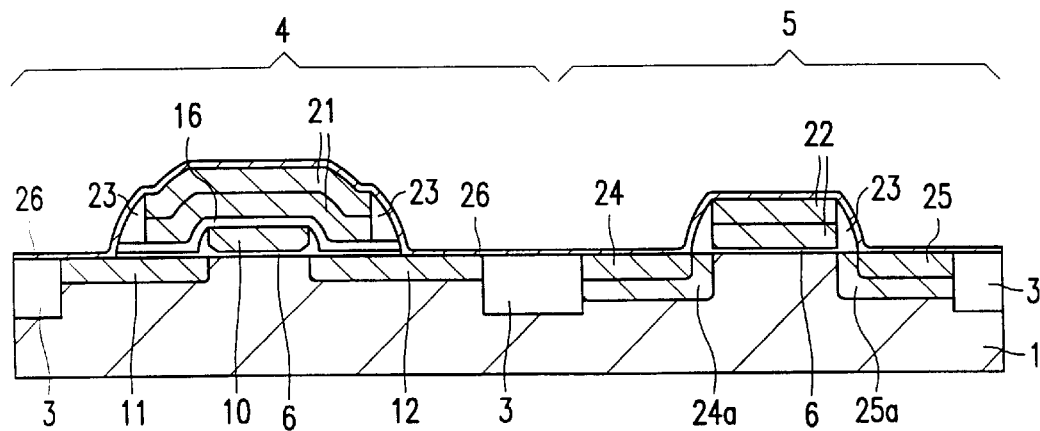
Figure 8:
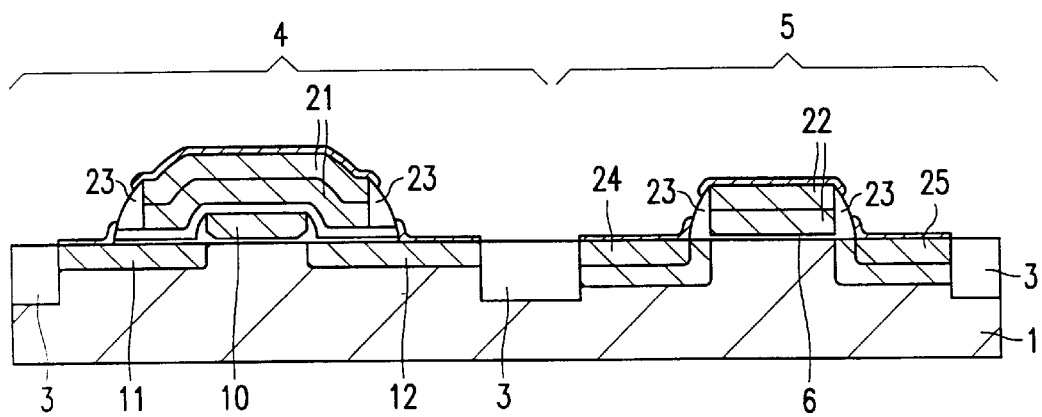

In a next stage, a light oxidation step may be carried out for covering the sides of the poly gates 21 and 22 with oxide. Then an LDD implantation may be carried out in the active region 5. In a next step, the sides of the gates 21 and 22 are provided with spacers 23 in a manner known per se through deposition and etching back of an oxide layer. It is noted in this connection that the spacers on gate electrodes 21 and 22 are of substantially the same dimensions, which is important for the salicide process to be carried out subsequently. With the spacers 23 acting as a mask, the n-type source and drain zones 24 and 25 are subsequently formed through implantation of As ions. These zones are separated from the channel region of the transistor by the LDD zones 24a and 25a. After removal of the masks used for this and of exposed portions of the layer 16 and the silicon layer 6, a layer 26 of Ti is provided on the surface, whereby the situation shown in FIG. 7 is obtained. As can be seen in this Figure, the Ti layer 26 is locally in contact with the silicon body 1 and the poly gates 21 and 22, and locally with silicon oxide at the area of the spacers 23 and the field oxide 3. The Ti forms titanium silicide on the poly gates 21, 22 and on the source and drain zones of the transistors under the influence of heating, whereas the Ti does not change on the field oxide 3. On the flanks of the spacers 23 it only changes into silicide close to the source and drain zones and to the gate electrodes owing to diffusion of silicon, for the rest the spacers remain covered with Ti. Since the control electrode 21 of the memory transistor and the gate 22 of the logic transistor are of practically equal thickness, the spacers 23 also have practically the same height, so that the risk of bridging is small. The remaining Ti can be removed from the field oxide 3 and the flanks of the spacers 23 by means of a selective etching step by which Ti is etched much quicker than titanium silicide, so that the mutually separated low-ohmic silicide contacts 27 as shown in FIG. 8 are obtained.

The device may subsequently be subjected to usual further operations such as the formation of conductive connections with one or several metal layers and the provision of a glass layer. Such steps are generally known and are accordingly not described any further.

Figure 4:
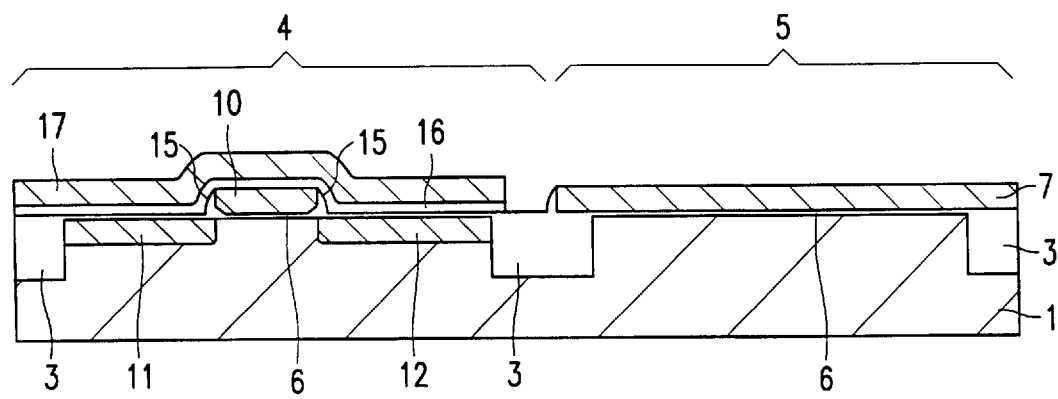
Figure 5:
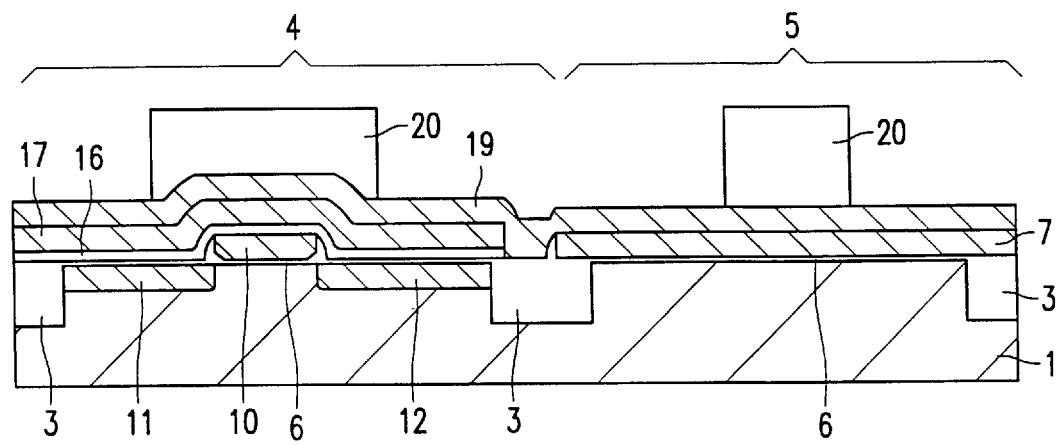
Figure 6:
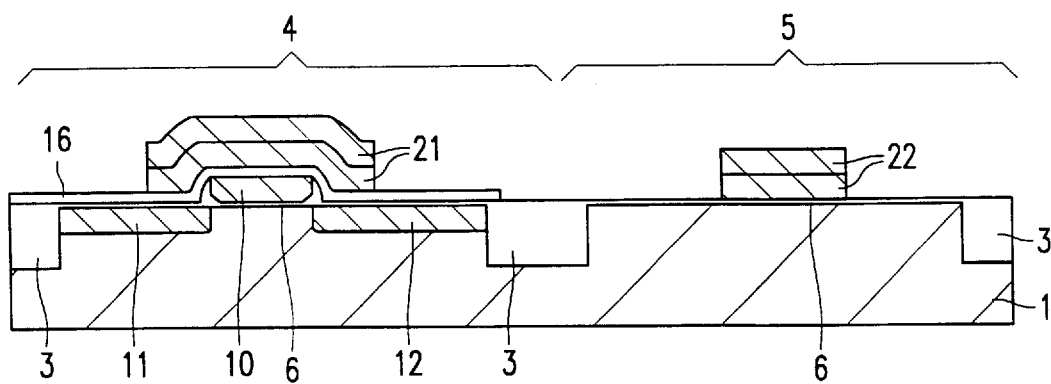
Figure 9:
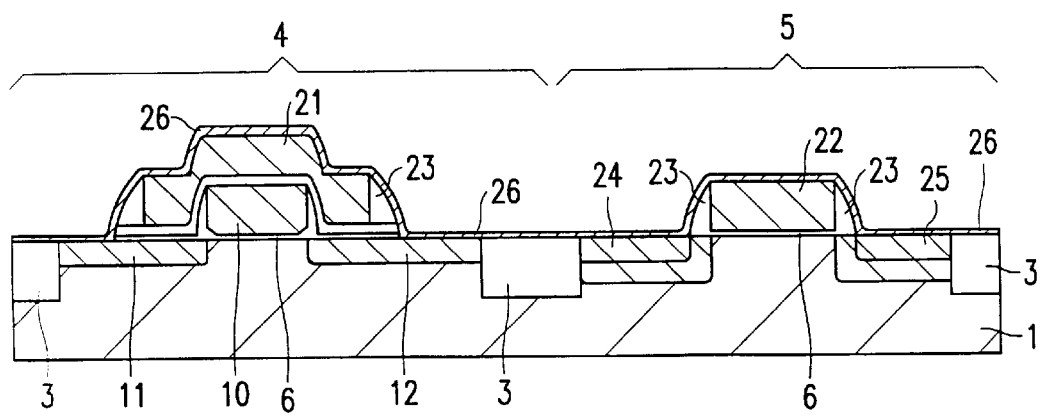
FIG. 9 is a cross-section of a modification of this device during manufacture.

In the example described here, the poly layer A, from which the floating gate 10 is completely and the gate 22 is partly manufactured, is followed by two more poly layers, i.e. the poly layer B from which the control electrode 21 is (partly) manufactured and the poly layer C from which the remainders of the control electrode 21 and of the gate 22 are manufactured. This embodiment has the advantage that the thickness of the floating gate can be chosen with a comparatively high degree of independene. A possible disadvantage is that the control electrode 21 and the gate 22 are formed from a composite poly layer, which may lead to the problem of gate depletion caused by an oxide layer at the boundary between the poly layers which forms a barrier to dopants during doping, so that the poly layer A is given a too low doping concentration. To counteract this disadvantage, a modification of the process described above may be used as described below with reference to FIG. 9. The stage shown in FIG. 9 corresponds to the stage shown in FIG. 7 for the first process, where the Ti layer 26 has been deposited. In the present modification, the thickness of the poly layer A is approximately 300 nm, i.e. twice that of the first embodiment. In a similar manner as described above, the floating gate 10 of the memory transistor is defined from this poly layer. The process steps up to and including the stage depicted in FIG. 4 are carried out while the active region 5 of the logic transistor remains covered by the poly layer A. The poly layer B from which the control electrode 21 of the memory transistor is defined is also approximately 300 nm thick. Subsequently the control electrode 21 of the memory transistor and the gate 22 of the logic transistor are defined by means of a mask corresponding to the mask 20 in the preceding embodiment (see FIG. 5). The further process steps are identical to those in the preceding embodiment. Since the control electrode 21 and the gate 22 are of equal thickness, the process can be carried out in a reproducible manner while avoiding the problems described above of overetching and bridging. Compared with the preceding embodiment, the comparatively great thickness of the floating gate 10 leads to a less plane structure, which in general may render subsequent process steps a little more difficult. On the other hand, the structure of FIG. 9 has the advantage that gate depletion is prevented and the advantage that the floating gate has a large flank surface, so that the capacitance between the floating gate and the overlapping control electrode 21 is comparatively great.

It will be apparent that the invention is not limited to the embodiments given here but that many more variations are possible to those skilled in the art within the scope of the invention. Thus the invention also offers major advantages in embodiments without silicide layers. It is also possible to invert the conductivity types in the embodiments described. The silicon oxynitride layer 8 may be omitted, if so desired, in the first embodiment of the process described.

What is claimed is:

1. A method of manufacturing a semiconductor device with a semiconductor body made of silicon which is provided at a surface with a first MOS transistor with an insulated gate of polycrystalline or amorphous silicon and with a non-volatile programmable memory element in the form of a second MOS transistor with an electrically floating gate of polycrystalline or amorphous silicon and with a control electrode of polycrystalline or amorphous silicon situated above the floating gate and electrically insulated therefrom, which method is characterized by the following steps:

defining a first active region for the first MOS transistor and of a second active region for the second MOS transistor, both at the surface of the semiconductor body;

providing an electrically insulating layer on the first and second active regions so as to form the gate dielectrics of the first and second MOS transistors, respectively;

depositing a first polycrystalline or amorphous silicon layer above the first and second active regions, separated therefrom by the insulating layer;

providing a dielectric layer on the first silicon layer;

providing a second polycrystalline or amorphous silicon layer above the first silicon layer and separated therefrom by the dielectric layer, the thickness of the second silicon layer being equal or at least substantially equal to the thickness of the first silicon layer;

removing the second silicon layer at the area of the first active region;

defining the floating gate, the control electrode, and the insulated gate from the deposited silicon layers, the floating gate being defined by forming the floating gate from the first silicon layer before the second silicon layer is deposited; and, after forming the floating gate providing source and drain zones of the second MOS transistor through doping, while masking the first active region against doping by the first silicon layer.

2. A method as claimed in claim 1, characterized in that a third polycrystalline or amorphous silicon layer is deposited after the removal of the second silicon layer above the first active region, and in that the control electrode and the insulated gate are formed from the combined second and third silicon layers.

3. A method as claimed in claim 1, characterized in that flanks of the floating gate are covered with a silicon oxide layer through thermal oxidation before the second silicon layer is deposited.

4. A method as claimed in claim 1, characterized in that the source and drain zones of the MOS transistors, the control electrode, and the insulated gate are provided with a silicide top layer comprising an alloy of silicon and a metal by means of a salicide process.

* * * * *